(12) United States Patent
Kihara et al.

(10) Patent No.: US 8,080,106 B2
(45) Date of Patent: Dec. 20, 2011

(54) EPITAXIAL SILICON WAFER AND PRODUCTION METHOD THEREOF

(75) Inventors: Takayuki Kihara, Tokyo (JP);
Kazushige Takaishi, Tokyo (JP);
Yasuyuki Hashimoto, Tokyo (JP)

(73) Assignee: Sumco Corporation, Minato-ku (JP)

( * ) Notice: Subject to any disclaimer, the term of this patent is extended or adjusted under 35 U.S.C. 154(b) by 100 days.

(21) Appl. No.: 12/506,147

(22) Filed: Jul. 20, 2009

(65) Prior Publication Data

US 2010/0032806 A1 Feb. 11, 2010

(30) Foreign Application Priority Data

Jul. 31, 2008 (JP) .................................. 2008-197504

(51) Int. Cl.
*C30B 29/06* (2006.01)

(52) U.S. Cl. ................ 117/84; 117/90; 117/92; 117/93; 438/455; 438/507

(58) Field of Classification Search .................... 117/84, 117/90, 92, 93; 438/455, 507
See application file for complete search history.

(56) References Cited

U.S. PATENT DOCUMENTS

| | | | | |
|---|---|---|---|---|
| 5,834,363 | A | * 11/1998 | Masanori | 438/507 |
| 7,902,039 | B2 | * 3/2011 | Tomita et al. | 438/455 |
| 2005/0215858 | A1 | * 9/2005 | Vail, III | 600/135 |

FOREIGN PATENT DOCUMENTS

| JP | 06-112120 A | 4/1994 |
|---|---|---|
| JP | 2008-140856 A | 6/2008 |

* cited by examiner

*Primary Examiner* — Bob M Kunemund
(74) *Attorney, Agent, or Firm* — Christensen O'Connor Johnson Kindness PLLC

(57) ABSTRACT

Provided are an epitaxial silicon wafer in which the warping is reduced by rendering a cross-sectional form of a silicon wafer for epitaxial growth into an adequate form as compared with the conventional one, and a production method thereof. An epitaxial silicon wafer comprising a silicon wafer for epitaxial growth and an epitaxial layer is characterized in that the epitaxial layer is formed on a silicon wafer for epitaxial growth having a cross-sectional form satisfying a relation of a given expression.

1 Claim, 4 Drawing Sheets

EPITAXIAL SILICON WAFER AND PRODUCTION METHOD THEREOF

BACKGROUND

1. Field of the Invention

This invention relates to an epitaxial silicon wafer and a production method thereof.

2. Description of the Related Art

Silicon wafers used in semiconductor devices are generally called bulk wafers or epitaxial wafers. A bulk wafer is a mirror-finished wafer formed by slicing an ingot-shaped silicon single crystal grown using, for example, a Czochralski method (CZ method) into a disc-shaped wafer and then polishing a surface thereof. On the other hand, an epitaxial wafer is formed using a mirror-finished wafer as a wafer for epitaxial growth and further growing a silicon single crystal silicon on the wafer for epitaxial growth using an epitaxial technique.

In principle, damage or strain due to polishing, as occurs in the mirror-finished wafer, is not existent for an epitaxial wafer. Therefore, it is known that epitaxial wafers show improved properties compared to mirror-finished wafers in the field of semiconductor devices requiring a higher quality, but epitaxial wafers are not widely put into practice because of high production cost.

However, a large-size wafer having a diameter of 450 mm has now been developed to increase cost per epitaxial wafer and also high-quality epitaxial wafers are increasingly associated with ultra-miniaturization of devices.

As previously mentioned, the epitaxial wafer is formed by growing an epitaxial layer on the wafer for epitaxial growth. In this case, the wafer for epitaxial growth has a low resistance and the epitaxial layer has a high resistance. A mismatch of lattice constant is caused therebetween, and warping may be caused to mitigate strain between atomic layers. Such a warping leads to chucking and transfer issues and increases with an increase in the diameter of the wafer.

Patent Document 1 proposes a method of producing an epitaxial silicon wafer in which an epitaxial layer is formed on a surface of a silicon wafer for epitaxial growth having a concaved surface by identifying an unevenness of a warped form in the silicon wafer for epitaxial growth and then estimating warping produced when the epitaxial layer is formed on the wafer surface.

[Patent Document 1] JP-A-H06-112120

In this production method, the warping produced in the epitaxial growth is offset by previously identifying the warping in the surface of the silicon wafer for epitaxial growth and rendering the direction of the warping into a direction opposite to a changing direction of warping produced in the epitaxial growth, whereby an absolute value of the warping in the epitaxial silicon wafer can be reduced. However, the warping in the surface of the silicon wafer for epitaxial growth is randomly formed in the slicing step and does not necessarily correspond to the change of the warping produced in the epitaxial growth.

Then, the inventors have proposed an epitaxial silicon wafer enabling reduction of warping amount by forming an epitaxial layer on a surface of a silicon wafer for epitaxial growth to which a bowl-shaped warping having a concaved central portion is given by subjecting a thin disc-shaped wafer to either grinding or polishing or both treatments in Patent Document 2.

[Patent Document 2] JP-A-2008-140856

This wafer is obtained by forming an epitaxial layer on a silicon wafer for epitaxial growth having a cross-sectional shape formed so as to satisfy the following expression (5), which is determined by the following expression (3) and (4) introduced by a conventional method, and can provide a flat epitaxial silicon wafer by offsetting the warping produced in the growth of epitaxial layer.

$$\varepsilon_1 = \frac{1}{3}\left(\frac{t_{si}^2}{t_{epi}}\right)\left(\frac{\delta}{r^2}\right) \tag{3}$$

$$\varepsilon_2 = \frac{\Delta a_{si-B}}{a_{si}} = \frac{-2.69 \times 10^{-23} \times [B]}{5.43} \tag{4}$$

$$\delta = \frac{-2.69 \times 10^{-23} \times [B]}{5.43} \times 3 \times r^2 \times \left(\frac{t_{epi}}{t_{si}^2}\right) \tag{5}$$

In the expression (3), $\varepsilon_1$ is strain in an epitaxial layer, $t_{si}$ is a thickness of a silicon wafer for epitaxial growth, $t_{epi}$ is a thickness of an epitaxial layer, $\delta$ is the warping of an epitaxial silicon wafer and r is a radius of a wafer. In the expression (4), $\varepsilon_2$ is strain based on a difference in lattice constant between a silicon wafer for epitaxial growth and an epitaxial layer, [B] is a boron concentration, $\Delta a_{si-B}$ is a difference in lattice constant between a silicon wafer for epitaxial growth having [B] and a non-doped epitaxial layer and $a_{si}$ is a lattice constant of an epitaxial layer. Also, it is assumed that strain $\varepsilon_1$ in the epitaxial layer is equal to strain $\varepsilon_2$ based on a difference in lattice constant between a silicon wafer for epitaxial growth and an epitaxial layer.

In the method described in Patent Document 2, an epitaxial silicon wafer with reduced warping can be provided by offsetting the warping produced in the growth of epitaxial layer as compared with the conventional method in which an epitaxial layer is grown using a wafer for epitaxial growth having no rationalization of cross-sectional form (that is, having a flat form without warping), but it is not sufficient. Particularly, the warping is not sufficiently reduced in an epitaxial silicon wafer having a large diameter of not less than 450 mm, and further improvement is required.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

It is an object of the invention to provide an epitaxial silicon wafer in which the warping is reduced by rendering the cross-sectional form of a silicon wafer for epitaxial growth into an appropriate form, as compared with Patent Document 2, and a method of producing the same.

(1) An epitaxial silicon wafer is provided, comprising a silicon wafer for epitaxial growth and an epitaxial layer, wherein the epitaxial layer is formed on the silicon wafer for epitaxial growth with a cross-sectional form satisfying a relation of the following expression (1):

$$\Delta \text{Bow}_{mv} = \Delta \text{Bow}_{cv} \times k \tag{1}$$

wherein $\Delta \text{Bow}_{mv}$ is a difference between a measured value $\Delta \text{Bow}_{ep}$ on the warping of the epitaxial silicon wafer after the epitaxial layer growth and a measured value $\Delta \text{Bow}_{pw}$ on the warping of the silicon wafer for epitaxial growth before the epitaxial layer growth when an epitaxial layer is formed on a flat silicon wafer for epitaxial growth (a material wafer), and $\Delta Bow_{cv}$ is a calculated value on the warping of an epitaxial silicon wafer based on a given computation expression, and k satisfies a relation of k=0.5±0.05.

(2) An epitaxial silicon wafer is provided according to the item (1), wherein the epitaxial silicon wafer is a large-size epitaxial silicon wafer having a diameter of not less than 450 mm and the warping thereof is not more than 1% of a thickness of the wafer.

(3) A method of producing an epitaxial silicon wafer is provided, which comprises subjecting a thin disc-shaped material wafer to a given treatment inclusive of grinding and/or polishing to form a silicon wafer for epitaxial growth with a cross-sectional form satisfying a relation of the following expression (2), and then growing an epitaxial layer on the silicon wafer for epitaxial growth:

$$\Delta Bow_{mv} = \Delta Bow_{cv} \times k \qquad (2)$$

wherein $\Delta Bow_{mv}$ is a difference between a measured value $\Delta Bow_{ep}$ on the warping of the epitaxial silicon wafer after the epitaxial layer growth and a measured value $\Delta Bow_{pw}$ on the warping of the silicon wafer for epitaxial growth before the epitaxial layer growth when an epitaxial layer is formed on a flat silicon wafer for epitaxial growth (a material wafer), and $\Delta Bow_{cv}$ is a calculated value on the warping of an epitaxial silicon wafer based on a given computation expression, and k satisfies a relation of k=0.5±0.05.

The invention can provide an epitaxial silicon wafer in which the warping is reduced by forming a cross-sectional form of a silicon wafer for epitaxial growth so as to satisfy the given expression as compared with the conventional one, and a method of producing the same.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

The invention will be described with reference to the accompanying drawings, wherein.

DETAILED DESCRIPTION

Figure 1A:
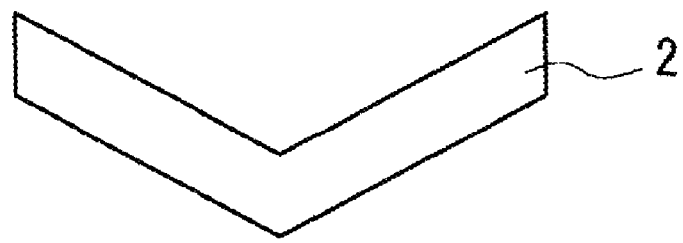
FIG. 1A is a schematically cross-sectional view of a silicon wafer for epitaxial growth before the formation of an epitaxial layer in the epitaxial silicon wafer according to the invention.

An embodiment of the epitaxial silicon wafer according to the invention will be described with reference to the accompanying drawings. FIG. 1A is a schematically cross-sectional view of a silicon wafer 2 for epitaxial growth constituting an epitaxial silicon wafer 1 according to the invention at a state before the formation of an epitaxial layer 3, and FIG. 1B is a schematically cross-sectional view of the epitaxial silicon wafer 1 after the formation of the epitaxial layer 3.

Figure 1B:
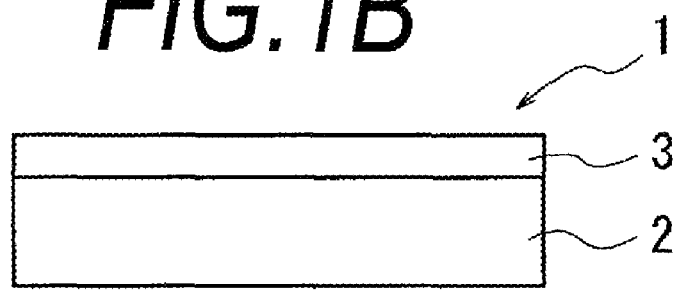
FIG. 1B is a schematically cross-sectional view showing a state after the formation of an epitaxial layer.

As shown in FIG. 1B, the epitaxial silicon wafer 1 of the invention is an epitaxial silicon wafer 1 comprising a silicon wafer 2 for epitaxial growth and an epitaxial layer 3, wherein the epitaxial layer 3 is formed on the silicon wafer 2 for epitaxial growth having a cross-sectional form shown in FIG. 1A according to a given expression wherein the warping is significantly reduced as compared with that of Patent Document 2.

For the silicon wafer 2 for epitaxial growth shown in FIG. 1A, it is preferable to use a thin disc-shaped material wafer obtained by cutting a silicon single crystal ingot doped with boron so as to render the resistivity between 0.1 and 0.001 $\Omega$cm and pulled by CZ method or FZ method using an inner diameter blade slicing apparatus, a wire saw apparatus, or the like.

Moreover, the silicon wafer 2 for epitaxial growth is formed so as to have a cross-sectional shape satisfying a relation of the following expression (1):

$$\Delta Bow_{mv} = \Delta Bow_{cv} \times k \qquad (1)$$

wherein $\Delta Bow_{mv}$ is a difference between a measured value $\Delta Bow_{ep}$ of the warping of an epitaxial silicon wafer after the epitaxial layer growth and a measured value $\Delta Bow_{pw}$ of the warping of a silicon wafer for epitaxial growth before the epitaxial layer growth when an epitaxial layer is formed on a flat silicon wafer for epitaxial growth (a material wafer), and $\Delta Bow_{cv}$ is a calculated value of the warping of an epitaxial silicon wafer based on a given computation expression, and k satisfies a relation of k=0.5±0.05. Moreover, $\Delta Bow_{cv}$ of the above expression (1) is equal to displacement of δ in the above expression (5).

Figure 2:
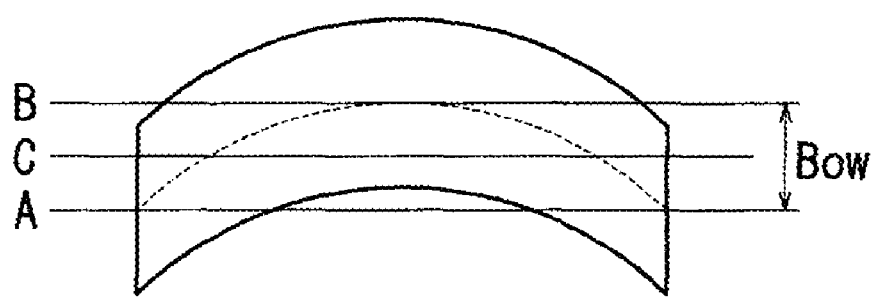
FIG. 2 is a schematic view explaining Bow.

As shown in FIG. 2, the term "Bow" generally indicates a shortest distance from a three-point reference plane or a best fit reference plane of the wafer (i.e., a line connecting between outer peripheral edge positions in a thickness centerline of the wafer, such as line A). Line B defines a third position for determining Bow and passes through a midpoint position in the thickness centerline of the wafer. The thickness centerline of the wafer is illustrated as a dashed line in FIG. 2.

Figure 3A:
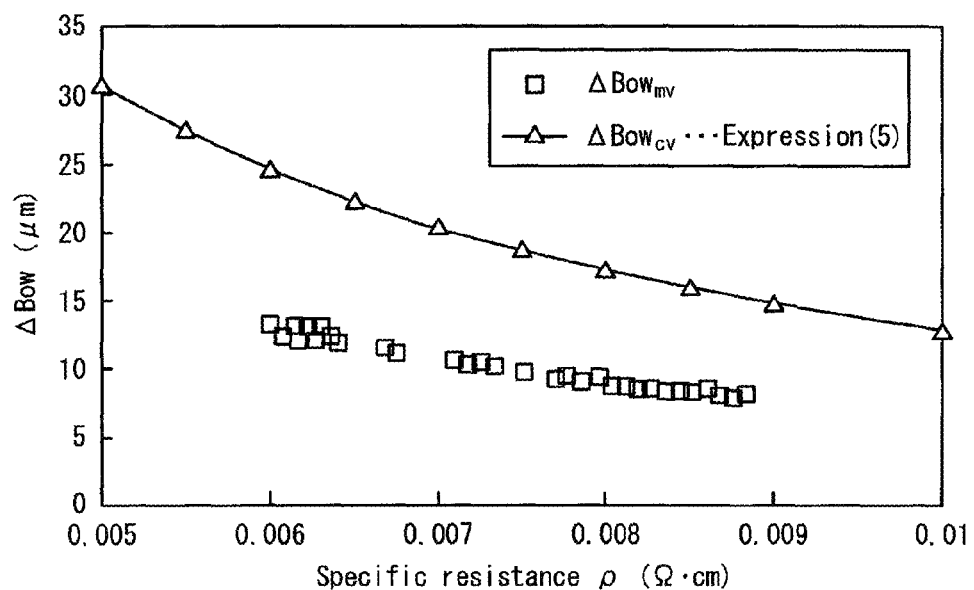
FIG. 3A is a graph where values of $\Delta Bow_{mv}$ are plotted on a graph showing a relation between $\Delta Bow_{cv}$ and specific resistance of a silicon wafer for epitaxial growth and a graph where values of $\Delta Bow_{cv}$ is multiplied by k.
Figure 3B:
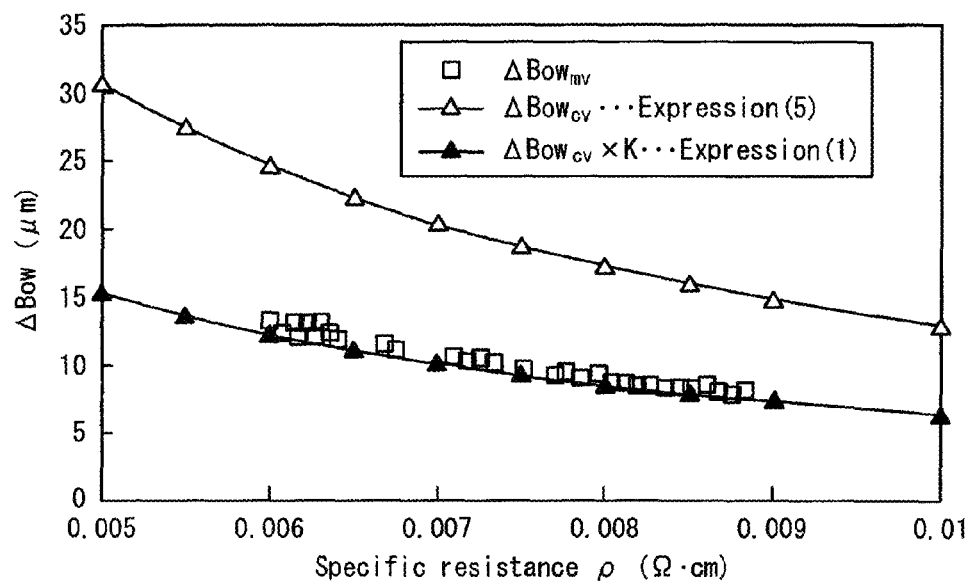
FIG. 3B is a graph where an expression (1) is added to the graph of FIG. 3A.

The feature that the silicon wafer 2 for epitaxial growth has a cross-sectional shape satisfying the relation of expression (1) means that a Bow value of the wafer for epitaxial growth (1) is approximately coincident with a value determined by expression (1). In FIG. 3A is shown values of $\Delta Bow_{mv}$ plotted on a graph showing a relation between $\Delta Bow_{cv}$ and specific resistance of a silicon wafer for epitaxial growth. The thickness of the silicon wafer for epitaxial growth is 775 μm, the thickness of the epitaxial layer is 2.75 μm, the radius of the wafer is 150 mm, and the specific resistance is dependent on the concentration of boron added. As shown in FIG. 3A, $\Delta Bow_{mv}$ does not correspond to the value of $\Delta Bow_{cv}$. To this end, the inventors have made various studies on a new expression capable of producing values equal to $\Delta Bow_{mv}$. As a result, expression (1) is derived by multiplying $\Delta Bow_{cv}$ by k (k=0.5±0.05) as shown in FIG. 3B, which is a computation expression consistent with found values.

As a reason why $\Delta Bow_{mv}$ is not consistent with the expression (5) of $\Delta Bow_{cv}$, it is considered that there is a problem setting a reference plane. The reference plane in expression (5) passes between the outer peripheral edge positions in the thickness centerline of the wafer as shown in FIG. 2. On the other hand, the reference plane in an actual measurement takes values averaging the shape of the whole back face of the wafer and it is considered that such a reference plane passes substantially a midpoint position between line A connecting between the outer peripheral edge positions in the thickness centerline of the wafer and the line B (e.g., line C) passing the midpoint position in the thickness centerline of the wafer. To this end, k is set to k=0.5±0.05.

Moreover, the cross-sectional shape of the silicon wafer 2 for epitaxial growth shown in FIG. 1A is preferable to be formed by conducting a given treatment inclusive of grinding and/or polishing as described later.

Also, the epitaxial silicon wafer 1 according to the invention shown in FIG. 1B is a large-size epitaxial silicon wafer having a diameter of not less than 450 mm and its warping is preferable to be not more than 1% of the wafer thickness. When the warping exceeds 1% of the wafer thickness, the occurrence of chucking and transfer trouble cannot be sufficiently prevented as an object of the invention.

The thickness of the epitaxial silicon wafer 1 having a diameter of not less than 450 mm is generally 900 to 1800 μm. However, in order to obtain an epitaxial silicon wafer 1 having a high flatness, the thickness uniformity of the silicon wafer 2 for epitaxial growth may be important. Therefore, it is preferable that the silicon wafer 2 for epitaxial growth according to the invention is uniform in the thickness. As to the thickness variation, the difference between a thickest portion and a thinnest portion is preferably not more than 1.0% of the thickest portion, more preferably not more than 0.5%. When the difference between the thickest portion and the thinnest portion exceeds 1.0% of the thickest portion, the warping of the silicon wafer 2 for epitaxial growth may be non-uniform in a part of the wafer, and also a geometrically conical warping cannot be produced, and hence the flatness of the resulting epitaxial silicon wafer 1 cannot be improved sufficiently.

Next, an embodiment of the method of producing an epitaxial silicon wafer of the invention will be described with reference to the accompanying drawings. In the production method of the epitaxial silicon wafer 1 according to the invention, the thin disc-shaped material wafer is subjected to a given treatment inclusive of grinding and/or polishing to form a silicon wafer 2 for epitaxial growth having a cross-sectional form satisfying a relation of the following expression (2), as shown in FIG. 1A, and an epitaxial layer 3 is grown on the silicon wafer 2 for epitaxial growth. By adopting this method can be provided an epitaxial silicon wafer having a reduced warping as compared with that of the conventional technique.

$$\Delta Bow_{mv} = \Delta Bow_{cv} \times k \qquad (2)$$

wherein $\Delta Bow_{mv}$ is a difference between a found value $\Delta Bow_{ep}$ on the warping of an epitaxial silicon wafer after the epitaxial layer growth and a found value $\Delta Bow_{pw}$ on the warping of a silicon wafer for epitaxial growth before the epitaxial layer growth when an epitaxial layer is formed on a flat silicon wafer for epitaxial growth (a material wafer), and $\Delta Bow_{cv}$ is a calculated value on the warping of an epitaxial silicon wafer based on a given computation expression, and k satisfies a relation of k=0.5±0.05.

Figure 4:
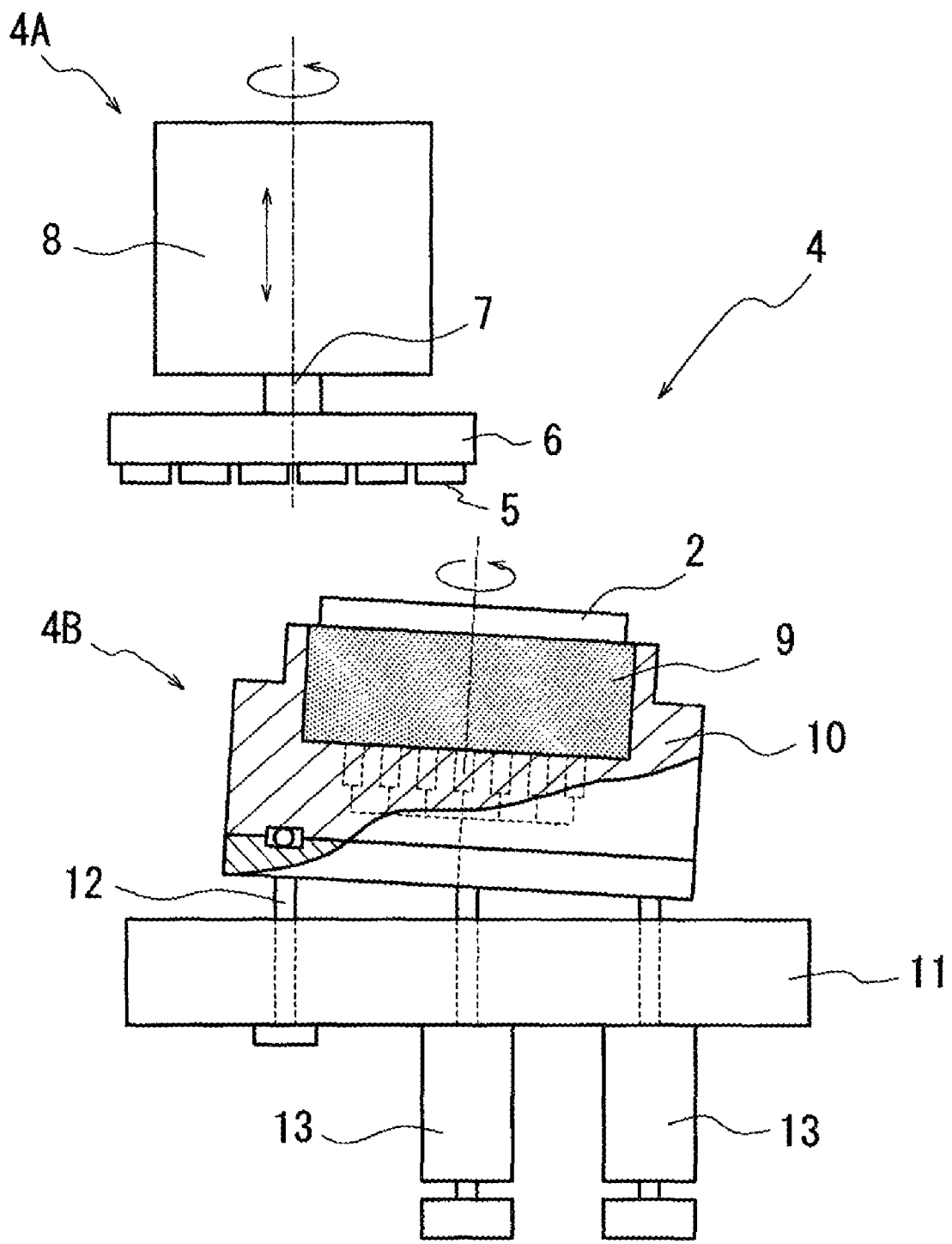
FIG. 4 is a schematic view of an apparatus for forming an epitaxial silicon wafer according to the invention.
Figure 5:
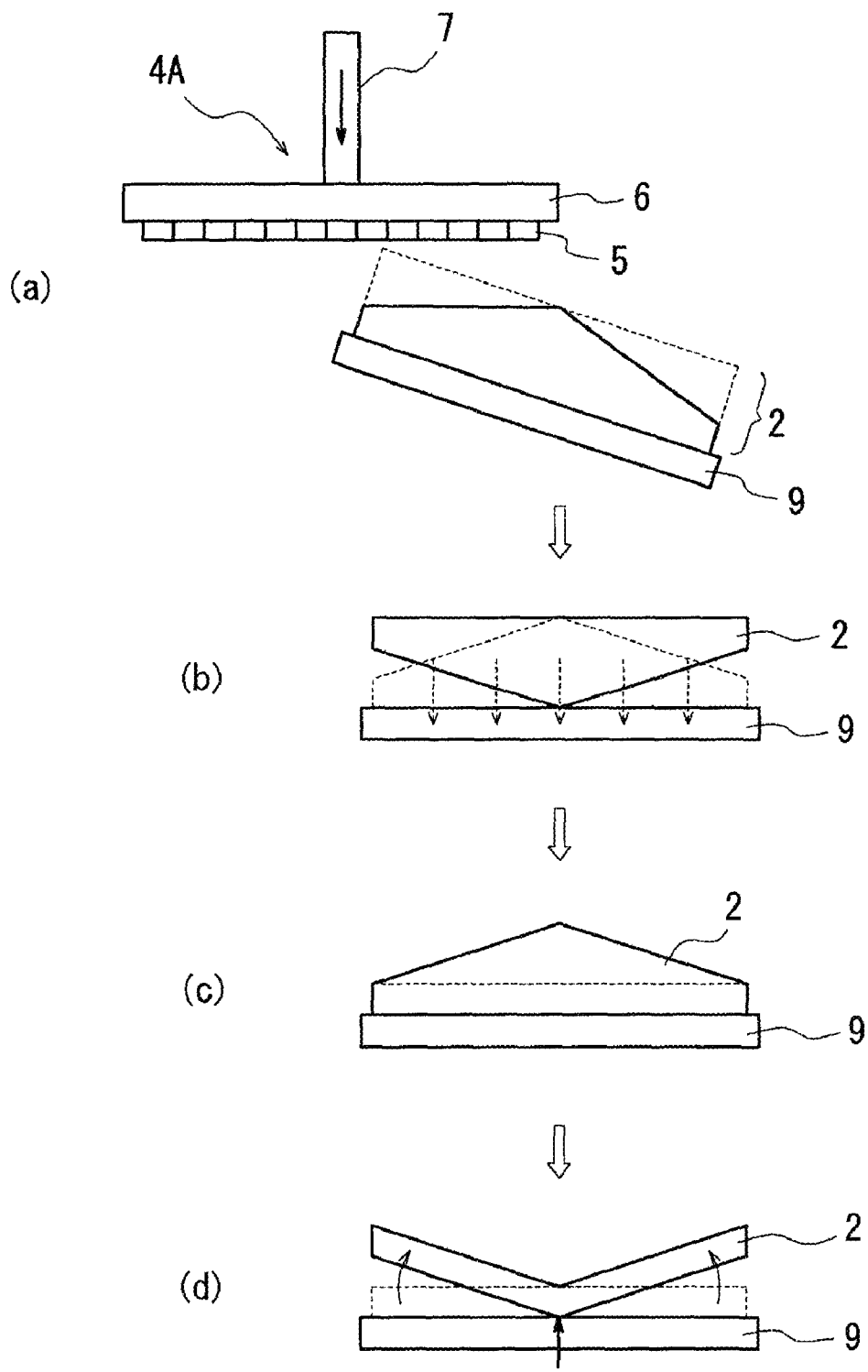
FIG. 5 is a schematic view showing production steps for an epitaxial silicon wafer according to the invention.

The silicon wafer 2 for epitaxial growth having the cross-sectional shape shown in FIG. 1A is formed by subjecting the thin disc-shaped material wafer to a given treatment inclusive of grinding and/or polishing. FIG. 4 is a schematic view illustrating an apparatus for producing a silicon wafer for epitaxial growth according to the invention, and FIG. 5 schematically shows steps for forming a silicon wafer 2 for epitaxial growth according to the invention.

The silicon wafer 2 for epitaxial growth is formed using an apparatus 4 shown in FIG. 4 as an example. For example, the apparatus 4 is constructed with a grinding device 4A and a holding device 4B. The grinding device 4A comprises a plurality of quadrangular prism-shaped grinding stones 5, a holder 6 for grinding stones, a rotational axis 7, a motor 8 for rotation, and a sliding means (not shown), in which the grinding stones 5 are held by the grinding stone holder 6 so as to position on the same circumference with the rotational axis 7 as a center and the motor 8 for rotation can rotate the grinding stone holder 6 through the rotational axis 7. Also, the sliding means holds the motor 8 for rotation liftability. Further, the holding device 4B comprises a hold table 9 holding a material wafer 2, a support table 10, a fixed base 11, a fixed shaft 12, and lifting shafts 13, in which the hold table 9 is embedded in the support table 10, and also the supporting table 10 is provided with one fixed shaft 12 and two lifting shafts 13 above the fixed base 11. In addition, the hold table 9 may be a circular disc made from a porous ceramic.

The grinding stone 5 is used by bonding abrasive grains having a granularity of #1500 (average grain size of 7.5 μm) to #10000 (average grain size of 0.5 μm) with a resin bond or a vitrified bond. These grinding stones 5 serve as a damage reduction means suppressing damages on a grinding surface of the thin disc-shaped material wafer 2 to not more than 2 μm.

The hold table 9 is constructed so that its upper face can be tilted at a desired angle by moving support points of the support table 10 up and down with the two lifting shafts 13 to incline the support table 10. Also, the support table 10 is provided with a rotating means (not shown) for rotating the hold table 9, and the hold table 9 is rotatably constructed at a state of tilting its upper face without changing the angle of the tilted face. Moreover, the inclination of the hold table 9 is explained here, but it may be constructed so as to incline the rotational axis 7 of the grinding stone holder 6.

FIG. 5 shows a method of producing a silicon wafer 2 for epitaxial growth 2 by grinding the thin disc-shaped material wafer 2 with the thus constructed apparatus 4. As partly shown in FIG. 5, step (a), the front face of the thin disc-shaped material wafer 2 is adsorption-retained by the hold table 9 to grind the back face of the wafer 2 to thereby prepare a convexed wafer having a thickness increased from an outer periphery of the wafer toward the wafer center, and thereafter the convexed back is adsorption-retained to protrude the center of the front face through elastic deformation (steps (b) and (c)), and then the front face is ground to make the main face flat and the adsorption-retention is released, whereby there can be obtained a silicon wafer 2 for epitaxial growth having a cross-sectional form with a concaved central portion according to expression 2 (step (d)). The above grinding treatment will be described below in detail. FIGS. 1A to 5 exaggeratingly show the warping of the material wafer for the sake of explanation, but the actual warping amount is an order of several tens of μm.

(Back Face Grinding Step)

There is first provided a thin disc-shaped material wafer 2 formable by cutting a rod ingot of silicon single crystal doped with boron so as to have a specific resistance of 0.1 to 0.001 Ωcm and pulled by the CZ method or the FZ method with an inner diameter blade slicing apparatus, a wire saw apparatus, or the like. As shown by a dashed line in FIG. 5, step (a), the material wafer 2 is put on the flat hold table 9 and adsorbed by the hold table 9 at a state of rendering the back face of the material wafer into an upper face. Thereafter, the support table 10 (FIG. 4) embedded with the hold table 9 is inclined together with the hold table 9. The inclination of the support table 10 is conducted by moving support points of the support table 10 up and down with the two lifting shafts 13 supporting the support table 10, whereby the horizontal upper face of the hold table 9 embedded in the support table 10 is inclined at a desired angle. At such a state, the hold table 9 is rotated together with the material wafer 2 in an arrow direction of FIG. 4 and the grinding stone holder 6 is rotated by the motor 8 for rotation in an arrow direction of FIG. 4. Next, the grinding stone holder 6 is moved downward to contact the grinding stones 5 with the back face of the material wafer 2 to thereby grind the material wafer 2 from the back face side with the grinding stones 6. Since the hold table 9 is inclined, the ground back face is of a chevron shape as shown by a solid line in FIG. 5, step (a), and the material wafer 2 has such a form that the center of the back face is projected so as to make the center portion thicker. Moreover, when a conical convex face having a pointed end in its central portion is formed, there is a tendency that nanotopography is deteriorated in the central portion of the wafer in the evaluation of surface flatness after epitaxial growth, so that it is preferable to conduct the grinding so as to form a convex face having a gentle curved face over the whole of the convex face.

(Front Face Grinding Step)

Next, the material wafer 2 is ground from the front face side. The material wafer 2, ground so as to project the center of the back face, is separated from the hold table 9, and then the back face with the projected center is placed on the hold table 9 as shown by a solid line in FIG. 5, step (b), and supported on the flat upper surface of the hold table 9 as shown by an arrow of dashed line. Since the upper surface of the hold table 9 is flat, as shown by a dashed line in FIG. 5, step (b), the back face of the material wafer 2 becomes flat through elastic deformation, while the front face of the material wafer 2 projects upward at the center thereof. Before or after the back face of the material wafer 2 is adsorption-retained by the hold table 9, the support table 10 is returned horizontally by moving support points of the support table 10 up and down with the two lifting shafts 13 supporting the support table 10, and hence the upper surface of the hold table 9 embedded in the support table 10 is returned horizontally.

Next, the hold table 9 is rotated together with the material wafer 2, and the grinding stone holder 6 is also rotated by the motor 7 for rotation. Then, as shown in FIG. 5, step (c), the material wafer 2 is ground from the front face side by bringing the grinding stones 5 into contact with the front face of the material wafer 2. Since the hold table 9 is returned horizontally, the ground front face becomes parallel to the hold table 9, and the material wafer 2 has a uniform thickness as shown by a dashed line. As the material wafer 2 having such a uniform thickness is released from the adsorption-retention by the hold table 9, the wafer 2 is restored through elastic force as shown by an arrow in FIG. 5, step (d), whereby there is obtained a silicon wafer 2 for epitaxial growth having a cross-sectional form according to expression (2) and a uniform thickness.

Although only an example wherein the convexed material wafer 2 projecting at the center of the back face is prepared so as to make the center of the material wafer 2 thicker in the front face grinding step and the back face grinding step is described as an embodiment of the invention, it is possible to produce a convex silicon wafer 2 for epitaxial growth having a uniform thickness by firstly preparing a concaved material wafer 2 with the center of the back face concaved so as to make the center of the material wafer 2 thinner.

Further, although the description has been provided for the exemplary embodiment of processing the wafer with the apparatus 4 in each grinding step, it is possible to obtain a silicon wafer for epitaxial growth having a cross-sectional form according to expression (2) even when a known mirror surface polishing apparatus is used instead of the apparatus 4, or it is possible to use the grinding apparatus together with a mirror surface polishing apparatus. In the latter case, it is possible to omit the mirror surface polishing step before epitaxial growth treatment.

Next, the method of producing an epitaxial silicon wafer 1 by using the above silicon wafer 2 for epitaxial growth will be described in detail.

There is provided a silicon wafer 2 for epitaxial growth having a cross-sectional form according to expression (2) by grinding and/or polishing a thin disc-shaped material wafer as shown in FIG. 1A. The silicon wafer 2 for epitaxial growth can be obtained by the aforementioned production procedure.

As shown in FIG. 1B, an epitaxial silicon wafer 1 is obtained by forming an epitaxial layer 3 on the surface of the silicon wafer 2 for epitaxial growth having a cross-sectional form according to expression 2. The formation of the epitaxial layer 3 can be conducted by growing the epitaxial layer 3 at a temperature ranged from 400° to 1200° C. by vapor deposition while supplying a material gas to the surface of the silicon wafer 2 for epitaxial growth with a carrier gas. Moreover, it is preferable that the surface of the silicon wafer 2 for epitaxial growth is mirror-polished before the formation of the epitaxial layer 3. The material gas is, for example, $SiH_2Cl_2$, $SiHCl_3$, $SiH_4$, $SiCl_4$, or the like, while $H_2$ can be used as the carrier gas.

As the material gas supplied for forming the epitaxial layer 3 can be also used a mixed gas of a semiconductor source gas and a halide gas. As the semiconductor source gas, monosilane ($SiH_4$), disilane ($Si_2H_6$), dichlorosilane ($SiH_2Cl_2$), trichlorosilane ($SiHCl_3$), silicon tetrachloride ($SiCl_4$) and the like can be used. Particularly, as the semiconductor source gas, it is preferable to use one of dichlorosilane ($SiH_2Cl_2$), trichlorosilane ($SiHCl_3$) and silicon tetrachloride ($SiCl_4$). As the halide gas, it is preferable to use one of hydrogen chloride (HCl), chlorine ($Cl_2$), fluorine ($F_2$), chlorine trifluoride ($ClF_3$), hydrogen fluoride (HF) and hydrogen bromide (HBr), and the use of hydrogen chloride (HCl) is particularly preferable.

Thus, the epitaxial silicon wafer 1 according to the invention can be produced by subjecting the thin disc-shaped material wafer to a given treatment inclusive of grinding and/or polishing to form the silicon wafer 2 for epitaxial growth having a cross-sectional form satisfying the relation of expression (2) and growing the epitaxial layer 3 on the silicon wafer 2 for epitaxial growth.

Moreover, FIGS. 1A to 5 show a representative embodiment, but the invention is not limited to this embodiment.

Example 1

By using the method according to the above embodiment to form an epitaxial layer on a silicon wafer for epitaxial growth having a cross-sectional form satisfying the relation of expression (1) is produced an epitaxial silicon wafer. In Example 1, the thickness of the silicon wafer for epitaxial growth is 775 µm, the thickness of the epitaxial layer is 2.75 µm, the radius of the wafer is 150 mm, the boron concentration is $1.13 \times 10^{19}/cm^3$, and the specific resistance is 0.0008 Ωcm. After production, the warping of the epitaxial silicon wafer is measured. Also, the warping of the material wafer before the formation of the above cross-sectional form was measured.

Example 2

An epitaxial silicon wafer is produced by the same method as in Example 1 except that the radius of the wafer is 225 mm, and the warping of the epitaxial silicon wafer is measured after the production. Also, the warping of the material wafer before the formation of the above cross-sectional form was measured.

Comparative Example 1

An epitaxial silicon wafer is produced by the same method as in Example 1 except that the grinding step is not conducted and the warping of the epitaxial silicon wafer is measured after the production. Also, the warping of the material wafer was measured.

Comparative Example 2

An epitaxial silicon wafer is produced by the same method as in Example 1 except that an epitaxial layer is formed on a silicon wafer for epitaxial growth having a cross-sectional form satisfying the relation of expression (5) and the warping of the epitaxial silicon wafer is measured after the production. Also, the warping of the material wafer before the formation of the above cross-sectional form was measured.

Comparative Example 3

An epitaxial silicon wafer is produced by the same method as in Example 2 except that the grinding step is not conducted and the warping of the epitaxial silicon wafer is measured after the production. Also, the warping of the material was measured.

Comparative Example 4

An epitaxial silicon wafer is produced by the same method as in Example 2 except that an epitaxial layer is formed on a silicon wafer for epitaxial growth having a cross-sectional form satisfying the relation of expression (5) and the warping of the epitaxial silicon wafer is measured after production. Also, the warping of the material wafer before the formation of the above cross-sectional form was measured.

(Evaluation)

Table 1 shows the warping of the epitaxial silicon wafer, the warping of the material wafer, and the thickness of the epitaxial silicon wafer, as well as the value k, which is a calculated value of expression (1). and the ratio of warping of the epitaxial silicon wafer to the thickness of the epitaxial silicon wafer in Examples 1 and 2 and Comparative Examples 1 to 4.

TABLE 1

|  | $\Delta Bow_{cv}$ (μm) | K | $\Delta Bow_{cv} \times k$ (μm) | Warping of material wafer (μm) | Cross-sectional form of silicon wafer for epitaxial growth (μm) | Warping of epitaxial silicon wafer (μm) | Thickness of epitaxial silicon wafer (μm) | Warping/ Thickness × 100 (%) |
|---|---|---|---|---|---|---|---|---|
| Example 1 | 17.34 | 0.5 | 8.67 | 0.15 | −7.3 | 1.52 | 775 | 0.20 |
| Comparative Example 1 | — | — | — | 0.15 | 0.15 | 8.85 | 775 | 1.14 |
| Comparative Example 2 | 17.34 | — | — | 0.15 | −17.2 | −8.5 | 775 | −1.10 |
| Example 2 | 23.4 | 0.5 | 11.7 | 0.7 | −10.5 | 1.1 | 1000 | 0.11 |
| Comparative Example 3 | — | — | — | 0.7 | 0.7 | 12.9 | 1000 | 1.29 |
| Comparative Example 4 | 23.4 | — | — | 0.7 | −24.5 | −12.6 | 1000 | −1.26 |

As illustrated by Table 1, the warping of the epitaxial silicon wafer in Example 1 is smaller than those of Comparative Examples 1 and 2. Similarly, the warping of the epitaxial silicon wafer in Example 2 is smaller than those of Comparative Examples 3 and 4. Also, it is shown that the ratio of the warping of the epitaxial silicon wafer to the thickness of the epitaxial silicon wafer is not more than 1% in both Examples 1 and 2.

According to the invention, there can be provided an epitaxial wafer in which the warping is reduced by forming a cross-sectional form of a silicon wafer for epitaxial growth so as to satisfy the given expression as compared with the conventional expression, and a method of producing the same.

While illustrative embodiments have been illustrated and described, it will be appreciated that various changes can be made therein without departing from the spirit and scope of the invention.

What is claimed is:

1. A method of producing an epitaxial silicon wafer, which comprises subjecting a thin disc-shaped silicon wafer to a given treatment inclusive of grinding and/or polishing to form a silicon wafer for epitaxial growth with a cross-sectional form satisfying the following expression (2), and then growing an epitaxial layer on the silicon wafer for epitaxial growth:

$$\Delta Bow_{mv} = \Delta Bow_{cv} * k \quad (2)$$

wherein $\Delta Bow_{mv}$ is a difference between a measured value $\Delta Bow_{ep}$ of the warping of the epitaxial silicon wafer after the epitaxial layer growth and a measured value $\Delta Bow_{pw}$ of the warping of the silicon wafer for epitaxial growth before the epitaxial layer growth when an epitaxial layer is formed on a flat silicon wafer for epitaxial growth, and $\Delta Bow_{cv}$ is a calculated value of the warping of the epitaxial silicon wafer based on a given computational expression, and k=0.5±0.05.

* * * * *